United States Patent
Betts

(10) Patent No.: US 6,608,486 B1
(45) Date of Patent: Aug. 19, 2003

(54) AUTOMOTIVE TEST DEVICE FOR DETECTING A SHORT CIRCUIT IN AUTOMOTIVE WIRING

(76) Inventor: Richard M. Betts, 21319 Chase St., Canoga Park, CA (US) 91304

( * ) Notice: Subject to any disclaimer, the term of this patent is extended or adjusted under 35 U.S.C. 154(b) by 87 days.

(21) Appl. No.: 09/589,239

(22) Filed: Jun. 7, 2000

(51) Int. Cl.$^7$ ................................................. G01R 31/00
(52) U.S. Cl. ..................................................... 324/503
(58) Field of Search ............................... 324/503, 384; 361/826, 827, 828

(56) References Cited

U.S. PATENT DOCUMENTS

| | | | |
|---|---|---|---|
| 2,382,647 A | 8/1945 | McLoughlin et al. | 324/503 |
| 2,625,596 A | 1/1953 | Hines | 246/169 R |
| 2,643,370 A | 6/1953 | Lawrence | 340/652 |
| 3,074,013 A | * 1/1963 | Bowden | 324/503 |
| 3,699,433 A | 10/1972 | Smith, Jr. | 324/523 |
| 3,786,466 A | 1/1974 | Naito et al. | 340/651 |
| 3,829,763 A | 8/1974 | Morin | 324/503 |
| 3,973,193 A | 8/1976 | Hayes | 324/507 |
| 4,028,621 A | 6/1977 | Bloxam | 324/556 |
| 4,095,172 A | 6/1978 | Strand | 324/503 |
| 4,177,420 A | 12/1979 | Tripp | 324/503 |
| 4,207,517 A | 6/1980 | Bloxam | 324/556 |
| 4,366,434 A | 12/1982 | Ellis | 324/556 |
| 4,584,526 A | 4/1986 | Lobastov | 324/133 |
| 4,689,573 A | 8/1987 | Hilmer | 324/380 |
| 4,740,745 A | 4/1988 | Sainz | 324/133 |
| 4,878,025 A | 10/1989 | Persson | 324/503 |
| 4,999,574 A | 3/1991 | Stephens | 324/133 |
| 5,030,916 A | * 7/1991 | Bokitch | 324/503 |
| 5,367,250 A | 11/1994 | Whisenand | 324/133 |
| 5,604,439 A | 2/1997 | Walkington | 324/504 |

FOREIGN PATENT DOCUMENTS

FR  2662-257  11/1991

* cited by examiner

Primary Examiner—Safet Metjahic
Assistant Examiner—Etienne P LeRoux
(74) Attorney, Agent, or Firm—Thomas I. Rozsa; Tony D. Chen

(57) ABSTRACT

A test device for indicating short-circuits in automotive wiring of a vehicle utilizing a 12-volt electrical system and including two incandescent lamps connected in series on opposite sides of a resettable circle breaker. The test devide is connected in series with the fuse junctions of a particular electrical circuit of the vehicle while the fuse is remove, when the second lamp is illuminated, then everything is normal and the particular electrical circuit of the vehicle is healthy, but if the second lamp is not illuminated and the first lamp is illuminated, this means that there is a short-circuit.

10 Claims, 2 Drawing Sheets

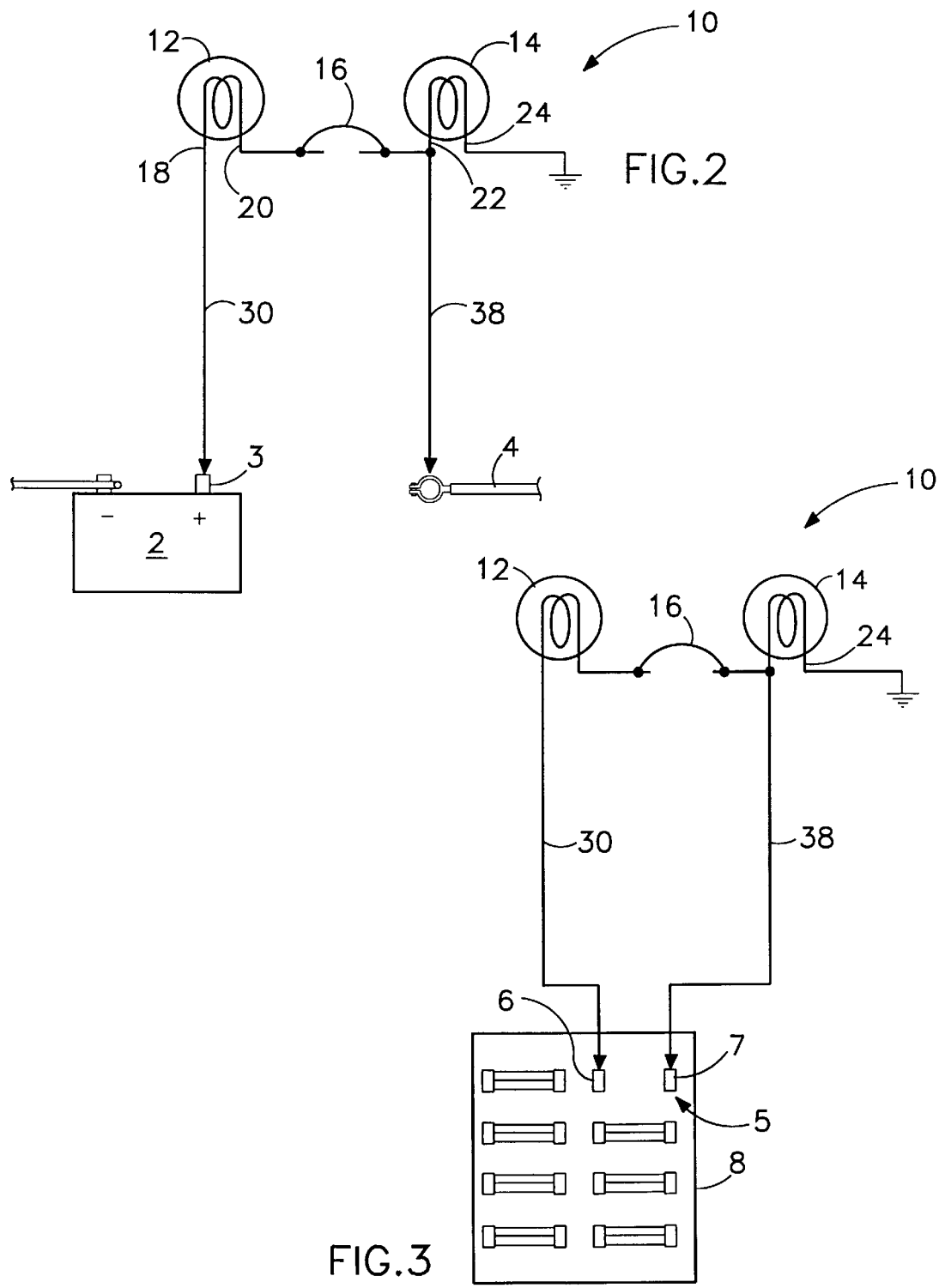

AUTOMOTIVE TEST DEVICE FOR DETECTING A SHORT CIRCUIT IN AUTOMOTIVE WIRING

BACKGROUND OF THE INVENTION

1. Field of the Invention

The present invention generally relates to the field of test equipment for the automotive industry. More particularly, the present invention relates to the field of test devices for indicating short circuits or draws in automotive wiring of vehicles.

2. Description of the Prior Art

Specifically, test equipment are well known in the art. A wide variety of sophisticated test equipment has been made available for troubleshooting and adjusting the various systems of vehicles. Most of the test equipment used for vehicle testing and maintenance employs electronic circuitry, which can range from the relatively simple to substantially complex. As a result, more complex electronic text equipment tends to be expensive, fragile and relatively large. However, it is desirable to perform simple electrical diagnostic tests on vehicle wiring systems, such as the presence of voltages.

The following twenty-two (22)prior art patents are found to be pertinent to the field of the present invention:

1. U.S. Pat. No. 2,382,647 issued to McLoughlin et al. on Aug. 14, 1945 for "Electrical Wiring System" (hereafter the "McLoughlin Patent");
2. U.S. Pat. No. 2,625,596 issued to Hines on Jan. 13, 1953 for "Circuit Checking Apparatus" (hereafter the "Hines Patent");
3. U.S. Pat. No. 2,643,370 issued to Lawrence on Jun. 23, 1953 for "Electric Circuit Checking Equipment" (hereafter the "Lawrence Patent");
4. U.S. Pat. No. 3,074,013 issued to Bowden on Jan. 15, 1963 for "Device For Indicating Short Circuits" (hereafter the "Bowden Patent");
5. U.S. Pat. No. 3,699,433 issued to Smith, Jr. on Oct. 17, 1972 for "Short Circuit Locator Apparatus Including A Plurality Of Intermittently Operated Circuit Breakers" (hereafter the "Smith Patent");
6. U.S. Pat. No. 3,786,466 issued to Naito et al. on Jan. 15, 1974 for "Electrical Leakage Detecting Device" (hereafter the "Naito Patent");
7. U.S. Pat. No. 3,829,763 issued to Morin on Aug. 13, 1974 for "Automotive Voltage And Continuity Tester" (hereafter the "Morin Patent");
8. U.S. Pat. No. 3,973,193 issued to Hayes on Aug. 3, 1976 for "Electric Light Tester And Unit Operating Device" (hereafter the "Hayes Patent");
9. U.S. Pat. No. 4,028,621 issued to Bloxam on Jun. 7, 1977 for "Portable Automotive Test Probe" (hereafter "the '621 Bloxam Patent");
10. U.S. Pat. No. 4,095,172 issued to Strand on Jun. 13, 1978 for "Vehicle Antenna Tester" (hereafter the "Strand Patent");
11. U.S. Pat. No. 4,177,420 issued to Tripp on Dec. 4, 1979 for "Major And Minor Short Leakage Detector" (hereafter the "Tripp Patent");
12. U.S. Pat. No. 4,207,517 issued to Bloxain on Jun. 10, 1980 for "Switchless D.C. Multifunction Tester" (hereafter "the '517 Bloxam Patent");
13. U.S. Pat. No. 4,366,434 issued to Ellis on Dec. 28, 1982 for "Voltage Detectors And Electrical Continuity Checkers" (hereafter the "Ellis Patent");
14. U.S. Pat. No. 4,584,526 issued to Lobastov on Apr. 22, 1986 for "Combination Continuity And Live Circuit Path Tester" (hereafter the "Lobastov Patent");
15. U.S. Pat. No. 4,689,573 issued to Hilmer on Aug. 25, 1987 for "On-Vehicle Diagnostic Unit For Electronic Ignition Systems" (hereafter the "Hilmer Patent");
16. U.S. Pat. No. 4,740,745 issued to Sainz on Apr. 26, 1988 for "Polarity And Continuity Tester For Primary And Secondary Automotive Circuits" (hereafter the "Sainz Patent");
17. U.S. Pat. No. 4,878,025 issued to Persson on Oct. 31, 1989 for "Trouble Finder For Testing An Electrical System Of A Vehicle For Short-Circuiting" (hereafter the "Persson Patent");
18. U.S. Pat. No. 4,999,574 issued to Stephens on Mar. 12, 1991 for "Switchable Automotive Circuit Test Light" (hereafter the "Stephens Patent");
19. U.S. Pat. No. 5,030,916 issued to Bokitch on Jul. 9, 1991 for "Auto Electric Tester" (hereafter the "Bokitch Patent");
20. U.S. Pat. No. 5,367,250 issued to Whisenand on Nov. 22, 1994 for "Electrical Tester With Electrical Energizable Test Probe" (hereafter the "Whisenand Patent");
21. U.S. Pat. No. 5,604,439 issued to Walkington et al. on Feb. 18, 1997 for "Tractor/trailer Lamp Circuit Continuity Test Device" (hereafter the "Walkington Patent"); and
22. French Patent No. 2662-257 for "Positive And Negative Voltage Checker For Vehicle Wiring" (hereafter the "French Patent").

The McLoughlin Patent discloses an electrical wiring system. It comprises a pair of lamps which are used to determine whether or not a fault exists. The load is connected across the mains having isolator switches in the positive and negative sides. The device of the McLoughlin Patent utilizes a 24-volt system.

The Hines Patent discloses a circuit checking apparatus.

The Lawrence Patent discloses an electric circuit checking equipment.

The Bowen Patent discloses a device for indicating short circuits. It comprises a plurality of lamp bulbs connected in parallel. A three-pole double throw switch is operable to one position when the device is used for locating a short circuit in a vehicle having a 6-volt system and to another position to condition the device for operation on a 12-volt system.

The Smith Patent discloses a short circuit locator apparatus including a plurality of intermittently operated circuit breakers.

The Naito Patent discloses an electrical leakage detecting device.

The Morin Patent discloses an automotive voltage and continuity tester. The tester includes an indicator branch having in series a pair of indicating lamps. One side of a battery is connected to a first terminal point of the indicating branch and a first test lead is connected to the other side of the battery. A second test lead is connected to the second terminal point of the indicating branch, so that when the pair of test leads are connected to a common conductor for testing continuity, the battery potential is applied at the terminal points of the indicator branch. A switched shorting branch is connected between the first terminal point and the junction of the indicator lamps.

The Hayes Patent discloses an electrical light tester and unit operating device. The '621 Bloxam Patent discloses a portable automotive test for rapidly and flexibly troubleshooting automotive electrical systems. The test probe features highly reliable electronic circuits energized from an automotive battery through a pair of connectors for connection to the terminals of the battery. A conductive test probe and a pair of indicator lamps are housed within a hand-held probe housing and enable an operator to rapidly trouble shoot the entire electrical system without alteration of any kind to the battery terminal connections.

The Strand Patent discloses a vehicle antenna tester.

The Tripp Patent discloses a major and minor short leakage detector. It comprises a current lead for connection to the positive battery terminal from which the battery cable has been disconnected, a sensor lead for connection to the disconnected cable, a silicon controlled rectifier and vehicle light bulbs connected across the leads for dissipating high currents caused by a major short, a trigger transistor connected across the leads for turning the rectifier on in response to the current drawn by any short, a minor short oscillator and a speaker for producing a constant frequency tone that signals a minor short, a major short oscillator for modulating the minor short oscillator causing it to produce a warbling tone that signals a major short, and a discriminator transistor responsive to the amount of current flowing across the leads for energizing the major short oscillator only in the presence of a major short.

The '517 Bloxam Patent discloses a self-contained hand-held portable pocket probe.

The Ellis Patent discloses voltage detectors and electrical continuity checkers.

The Lobastov Patent discloses a combination continuity and live circuit path tester.

The Hilmer Patent discloses an on-vehicle diagnostic unit for electronic ignition systems.

The Sainz Patent discloses a polarity and continuity tester for primary and secondary automotive circuits.

The Persson Patent discloses a trouble finder for testing an electrical system of a vehicle for short-circuiting. It comprises an oscillator which limits the current at the output to near 0 A as long as short-circuiting remains. When the short-circuiting ceases, this is detected by a unit of sensitivity and as a result of this, the oscillation stops and reset current and voltage levels are entered immediately and automatically.

The Stephens Patent discloses a switchable automotive circuit test light tool. The tool comprises a case to hold a probe, circuit, LED's and means to connect the tool to an automobile. A first light tells the operator the tool is ready for use and that the electrical connections to the storage battery are complete to a second light. The second light illuminates when the probe is in contact with the automobile system and continuity of the circuit exists. A switch on the tool selects current direction.

The Bokitch Patent discloses an auto electric tester which includes a casing, circuitry mounted within the casing and four electrical conductors extending from the casing and connected to the circuitry.

The Whisenand Patent discloses an electrical tester with an electrical energizable test probe.

The Walkington Patent discloses a tractor/trailer lamp circuit continuity test device. It comprises an auxiliary plug-and-socket assembly which has a plurality of pins at one end which plug into a socket at the rear end of a tractor vehicle and sockets at the other end which receive a plug form a trailer vehicle.

The French Patent discloses a positive and negative voltage checker for vehicle wiring.

None of these prior art patents have disclosed a test device for indicating a short circuit in automotive wiring of a vehicle utilizing a 12-volt electrical system. It is desirable to provide a test device that is simple in construction, easier to manufacture and can expedite the location of short-circuits or draws in automotive wiring more easily than known prior art.

SUMMARY OF THE INVENTION

The present invention is a unique test device for indicating short-circuits in automotive wiring of a vehicle utilizing a 12-volt electrical system.

The test device comprises two incandescent lamps connected on opposite sides of a resettable circuit breaker. Each incandescent lamp has a positive terminal and a negative terminal. The circuit breaker has a first terminal which is connected to the negative terminal of the first lamp and a second terminal which is connected to the positive terminal of the second lamp for protecting the automotive wiring and the test device from electrical damage.

A first test lead has one end which is connected to the positive terminal of the first lamp and the other end is connected to a first connector and being connectable to a first side of a fuse junction. A second test lead has one end which is connected to the positive terminal of the second lamp and the other end is connected to a second connector and being connectable to a second side of the fuse junction. A ground lead has one end which is connected to the negative terminal of the second lamp while the other end is connected to a third connector and being connectable to a ground or chassis of the vehicle. The test device is connected with the fuse junction of a particular electrical circuit of the vehicle while the fuse is removed, wherein when the second lamp is illuminated, then everything is normal and the particular electrical circuit of the vehicle is healthy, but if the second lamp is not illuminated and the first lamp is illuminated, this means that there is a short-circuit or draw being made on the particular electrical circuit of the vehicle causing the power to go out and illuminate the first lamp.

It is an object of the present invention to provide a test device that is simple and effective for indicating a short circuit or a draw in automotive wiring of a vehicle when a short circuit develops in the automotive wiring.

It is a further object of the present invention to provide a test device which facilitates the location of a short-circuit or a draw in automotive wiring.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated:

FIG. 2 is a diagram showing the present invention test device connected to a battery to insure that the system is functioning normally; and FIG. 3 is a diagram showing the present invention test device connected to fuse clips within a fuse block of a vehicle, without the fuse installed therein, for testing and indicating a short circuit or a draw in a specific automotive wiring corresponding to the fuse clips of the vehicle.

DETAILED DESCRIPTION OF THE PREFERRED EMBODIMENTS

Figure 1:
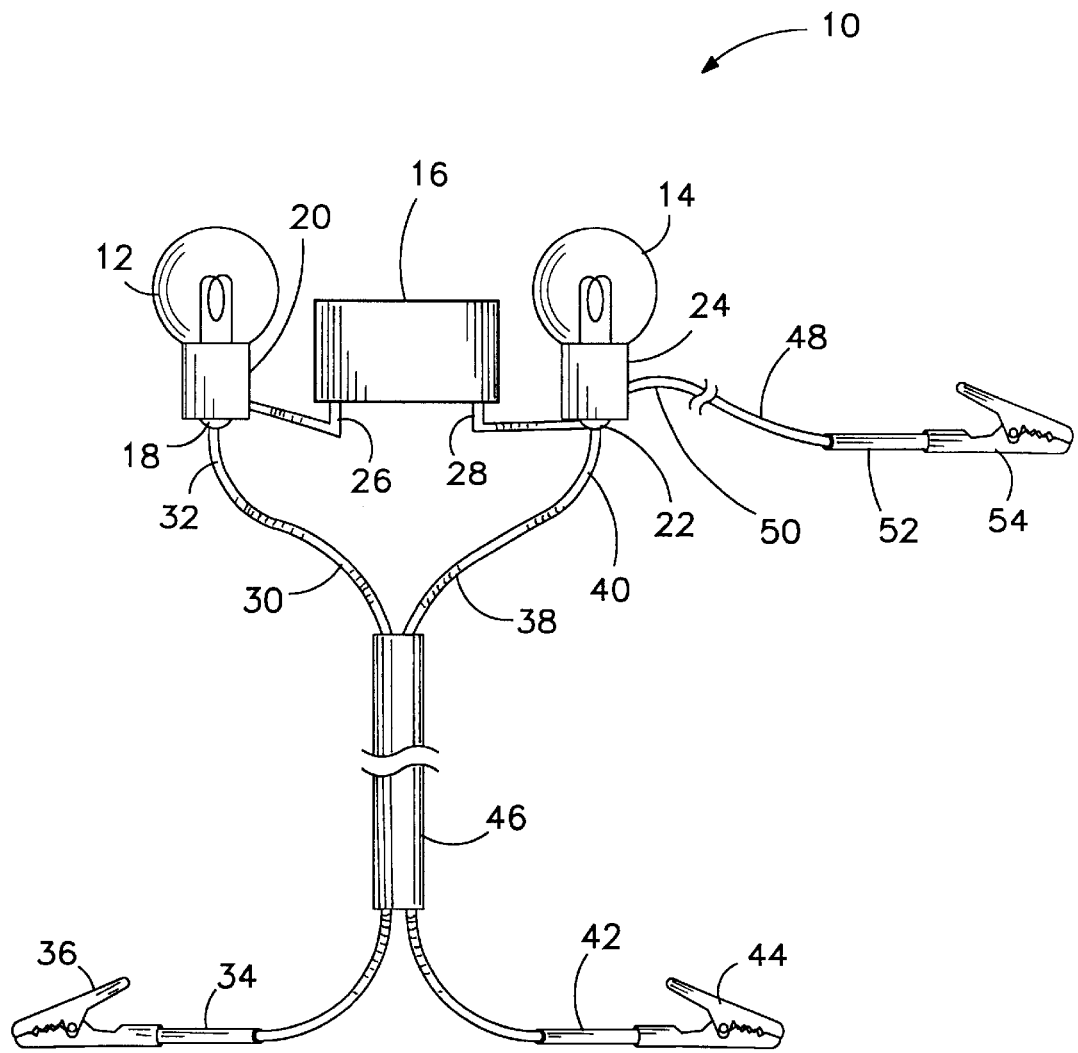
FIG. 1 is a perspective view of the present invention test device for indicating short-circuits.

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Referring to FIG. 1, there is shown at 10 the present invention test device for indicating short circuits or draws in automotive wiring of a vehicle (not shown). The present invention test device 10 deals with only 12-volt systems, such as motorcycles, cars, trucks and marine engines.

Referring to FIGS. 1, 2 and 3, the test device 10 comprises a large or first lamp 12, a small or second lamp 14, a resettable circuit breaker 16 connected between the large and small lamps 12 and 14. These lamps 12 and 14 are preferably 12-volt automobile incandescent bulbs. The lamps 12 and 14, and the circuit breaker 16 are conventional in the art.

The large lamp 12 has a positive terminal 18 and a negative terminal 20. The small lamp 14 also has a positive terminal 22 and a negative terminal 24. The circuit breaker 16 has a first terminal 26 which is electrically connected to the negative terminal 20 of the large lamp 12 and a second terminal 28 which is electrically connected to the positive terminal 22 of the small lamp 14. The circuit breaker 16 is utilized for protecting the tested electrical automotive wiring and the test device 10 from electrical damage.

An elongated flexible first insulated conductor 30 has one end 32 which is electrically connected to the positive terminal of the large lamp 12 and the other end 34 terminates into a conventional first alligator clip or connector 36. The first connector 36 may be connectable to a first side 6 of a fuse junction 5 of a fuse block 8 or to a positive terminal 3 of a battery 2 of the vehicle. An elongated flexible second insulated conductor 38 has one end 40 which is electrically connected to the positive terminal 22 of the second lamp 14 and the other end 42 terminates into a conventional second alligator clip or connector 44. The second connector 44 may be connectable to a second side 7 of the fuse junction 5 of the fuse block 8 or to a positive battery cable 4 of the vehicle, where the positive battery cable 4 is removed from the positive terminal 3 of the battery 2. Both conductors 30 and 38 may be further insulated by an insulated material 46.

An elongated flexible ground insulated conductor 48 has one end 50 which is electrically connected to the negative terminal 24 of the second lamp 14 and the other end 52 terminates into a conventional third alligator clip or connector 54. The ground conductor 48 may be connectable go as 14 to a ground or chassis of the vehicle.

It will be appreciated that the present invention test device is not limited to the large and small lamps 12 and 14. It is emphasized that while the large and small lamps are preferred, it is also within the spirit and scope of the present invention to utilize lamps with different types of colors. For example, the large lamp 12 is of one color (red) while the small lamp 14 is of another color (green).

The circuit breaker 16 between the two lamps 12 and 14 is not a requirement, but the reason for the circuit breaker 16 is that if the large lamp 12 itself is shorted out or is broken and the circuit breaker 16 was not there, the tested electrical automotive wiring would be burned. Therefore, the purpose of the circuit breaker 16 is to avoid the possibility that if, for whatever reason, the large lamp 12 shorts out, there is means to break the circuit so the automotive wires will not burn up.

The operation of the foregoing embodiment now will be described. The first thing is to test to see if there is power at all to the system to make sure that the battery 2 is not dead. The first connector 36 is attached to the positive terminal 3 of the battery 2 with the positive battery cable 4 unhooked from the battery positive terminal 3. The second connector 44 is attached to the positive battery cable 4. The third connector 54 which is the ground for the test device 10 is attached to a ground or chassis of the vehicle. If the small lamp 14 illuminates, it means that the battery 2 is good and there is power to the system so that a user does not waste time testing anything else.

The next step is to test a specific circuit, for example, a windshield wiper circuit. First, all of the battery cables are hooked normally. Second, the fuse for the windshield wiper circuit is removed from the fuse block 8. The first connector 36 is attached to the positive side 6 of the fuse junction 5 of the fuse block 8. The second connector is attached to the negative side 7 of the fuse junction 5 of the fuse block 8. The third connector 54 is attached to the ground or chassis of the vehicle. If the small lamp 14 is illuminated, then everything is normal and the windshield wiper circuit is good, but if the small lamp 14 is not illuminated and the large lamp 12 is illuminated, it means that there is a short-circuit or a draw being made on the windshield wiper circuit causing the power to go out and illuminate the large lamp 12. Therefore, there is a short in the windshield wiper circuit or a draw in the circuit.

Other than a fuse block, a user can do the same thing if there was a switch in the vehicle.

Defined in detail, the present invention is a test device for indicating a short-circuit in an electrical wiring of a vehicle utilizing a 12-volt electrical system, comprising: (a) a large incandescent lamp having a positive terminal and a negative terminal; (b) a small incandescent lamp having a positive terminal and a negative terminal; (c) a circuit breaker having a first terminal electrically connected to the negative terminal of the large incandescent lamp and a second terminal electrically connected to the positive terminal of the small incandescent lamp for protecting the electrical wiring and the test device from damage; (d) a first test lead having one end electrically connected to the positive terminal of the large incandescent lamp and the other end electrically connected to a first connector and being connectable to a first side of a fuse junction; (e) a second test lead having one end electrically connected to the positive terminal of the second incandescent lamp and the other end electrically connected to a second connector and being connectable to a second side of the fuse junction; and (f) a ground lead having one end electrically connected to the negative terminal of the second incandescent lamp and the other end electrically connected to a third connector and being connectable to a ground or chassis of the vehicle; (g) whereby when the test device is connected with the fuse junction of a particular electrical circuit of the vehicle while the fuse is removed, wherein when the small incandescent lamp is illuminated, then everything is normal and the particular electrical circuit of the vehicle is healthy, but if the small incandescent lamp is not illuminated and the large incandescent lamp is illuminated, this means that there is a short-circuit or draw being made on the particular electrical circuit causing the power to go out and illuminate the large incandescent lamp.

Defined broadly, the present invention is a test device for indicating a short-circuit in an electrical wiring of a vehicle utilizing a 12-volt electrical system, comprising: (a) a first indicating lamp having a first terminal and a second terminal; (b) a second indicating lamp having a first terminal and a second terminal; (c) a circuit breaker having a first terminal electrically connected to the second terminal of the first indicating lamp and a second terminal electrically connected to the first terminal of the second indicating lamp for protecting the automotive wiring and the test device from damage; (d) a first test lead having one end electrically connected to the first terminal of the first indicating lamp and the other end electrically connected to a first connector and being connectable to a first side of a fuse junction; (e) a second test lead having one electrically connected to the first terminal of the second indicating lamp and the other end electrically connected to a second connector and being connectable to a second side of the fuse junction; and (f) a ground lead having one end electrically connected to the second terminal of the second indicating lamp and the other end electrically connected to a third connector and being connectable to a ground or chassis of the vehicle; (g) whereby when the test device is connected with the fuse junction of a particular electrical circuit of the vehicle while the fuse is removed, wherein when the second indicating lamp is illuminated, then everything is normal and the particular electrical circuit of the vehicle is healthy, but if the second indicating lamp is not illuminated and the first indicating lamp is illuminated, this means that there is a short-circuit or draw being made on the particular electrical circuit of the vehicle causing the power to go out and illuminate the first indicating lamp.

Defined more broadly, the present invention is a test device for indicating a short-circuit in an electrical wiring of a vehicle utilizing a 12-volt electrical system, comprising: (a) first illuminating means having a first terminal and a second terminal; (b) second illuminating means having a first terminal connected to the second terminal of the first illuminating means and a second terminal being connectable to a ground or chassis of the vehicle; (c) a first lead having one end connected to the first terminal of the first illuminating means; and (d) a second lead having one end connected to the first terminal of the second illuminating means; (e) whereby when the test device is connected with a fuse junction of a particular electrical circuit of the vehicle while the fuse is removed, wherein when the second illuminating means is illuminated, then everything is normal and the particular electrical circuit of the vehicle is healthy, but if the second illuminating means is not illuminated and the first illuminating means is illuminated, this means that there is a short-circuit or draw being made on the particular electrical circuit of the vehicle causing the power to go out and illuminate the first illuminating means.

Of course the present invention is not intended to be restricted to any particular form or arrangement, or any specific embodiment, or any specific use, disclosed herein, since the same may be modified in various particulars or relations without departing from the spirit or scope of the claimed invention hereinabove shown and described of which the apparatus or method shown is intended only for illustration and disclosure of an operative embodiment and not to show all of the various forms or modifications in which this invention might be embodied or operated.

The present invention has been described in considerable detail in order to comply with the patent laws by providing full public disclosure of at least one of its forms. However, such detailed description is not intended in any way to limit the broad features or principles of the present invention, or the scope of the patent to be granted. Therefore, the invention is to be limited only by the scope of the appended claims.

What is claimed is:

1. A test device for testing electrical power of a 12 volt battery of a vehicle having a positive terminal for connection with a positive battery cable and a negative terminal for connection with a negative battery cable, and for indicating a short-circuit in an electrical element of the a vehicle protected by a removable fuse installed in a fuse junction with a positive terminal and a negative terminal, the test device comprising:

a. a first incandescent lamp having a positive terminal and a negative terminal;
   b. a second incandescent lamp having a positive terminal and a negative terminal;
   c. a first test lead having a first end electrically connected to said positive terminal of said first incandescent lamp and a second end electrically connected to a first test connector;
   d. a second test lead having a first end electrically connected to said positive terminal of said second incandescent lamp and a second end electrically connected to a second test connector;
   e. a ground lead having a first end electrically connected to said negative terminal of said second incandescent lamp and a second end electrically connected to a ground connector;
   f. a circuit breaker having a first terminal electrically connected to said negative terminal of said first incandescent lamp and a second terminal electrically connected to said first end of said second test lead for protecting said electrical clement and said test device from damage;
   g. whereby when said test device is used for testing electrical power of said battery, said first test connector is connected to said positive terminal of said battery, said second test connector is connected to said positive battery cable removed from said positive terminal of said battery, and said ground connector is connected to an electrical ground or a chassis of said vehicle, such that if said battery has electrical power, both said fist incandescent lamp and said second incandescent lamp will be illuminated, but if said battery has no electrical power, neither said first incandescent lamp nor said second incandescent lamp will be illuminated; and
   h. when said test device is used for indicating whether there is a short-circuit in said electrical element of said vehicle, said fuse protecting said electrical clement is removed, said first test connector is connected to said positive terminal of said fuse junction, said second test connector is connected to said negative terminal of said fuse junction, and said ground connector is connected to an electrical ground or said chassis of said vehicle, such that if there is no electrical short-circuit in said electrical element, both said first incandescent lamp and said second incandescent lamp will be illuminated, but if there is an electrical short-circuit in said electrical element, said first incandescent lamp will be illuminated but said second incandescent lamp will not be illuminated.

2. The test device in accordance with claim 1, wherein said large incandescent lamp is of one color and said small incandescent lamp is of another color.

3. A test device for testing electrical power of a 12 volt battery of a vehicle having a positive terminal for connection with a positive battery cable and a negative terminal for connection with a negative battery cable, and for indicating a short-circuit in an electrical element of the vehicle protected by a removable fuse installed in a fuse junction with a positive terminal and a negative terminal, the test device comprising:

a. a first indicating lamp having a positive terminal and a negative terminal;

b. a second indicating lamp having a positive terminal and a negative terminal;

c. a first test lead having a first end electrically connected to said positive terminal of said first indicating lamp and a second end electrically connected to a first test connector;

d. a second test lead having a first end electrically connected to said positive terminal of said second indicating lamp and a second end electrically connected to a second test connector;

e. a ground lead having a first end electrically connected to said negative terminal of said second indicating lamp and a second end electrically connected to a ground connector;

f. a circuit breaker having a first terminal electrically connected to said negative terminal of said first indicating lamp and a second terminal electrically connected to said first end of said second test lead for protecting said electrical element and said test device from damage;

g. whereby when said test device is used for testing electrical power of said battery, said first test connector is connected to said positive terminal of said battery, said second test connector is connected to said positive battery cable removed from said positive terminal of said battery, and said ground connector is connected to an electrical ground or a chassis of said vehicle, such that if said battery has electrical power, both said first incandescent lamp and said second indicating lamp will be illuminated, but if said battery has no electrical power, neither said first incandescent lamp nor said second indicating lamp will be illuminated; and h. when said test device is used for indicating whether there is a short-circuit in said electrical element of said vehicle, said fuse protecting said electrical element is removed, said first test connector is connected to said positive terminal of said fuse junction, said second test connector is connected to said negative terminal of said fuse junction, and said ground connector is connected to an electrical ground or said chassis of said vehicle, such that if there is no electrical short-circuit in said electrical element, both said first incandescent lamp and said second indicating lamp will be illuminated, but if there is an electrical short-circuit in said electrical element, said first indicating lamp will be illuminated but said second incandescent lamp will not be illuminated.

4. The test device in accordance with claim 3, wherein said first indicating lamp is of one color and said second indicating lamp is of another color.

5. A test device for testing electrical power of a 12 volt battery of a vehicle having a positive terminal for connection with a positive battery cable and a negative terminal for connection with a negative battery cable, and for indicating a short-circuit in an electrical element of the vehicle protected by a removable fuse installed in a fuse junction with a positive terminal and a negative terminal, the test device comprising:

a. a first illuminating means having a positive terminal and a negative terminal;

b. a second illuminating means having a positive terminal and a negative terminal;

c. a first test lead electrically connected to said positive terminal of said first illuminating means;

d. a second test lead electrically connected to said positive terminal of said second illuminating means and said negative terminal of said first illuminating means;

e. a ground lead electrically connected to said negative terminal of said second illuminating means;

f. whereby when said test device is used for testing electrical power of said battery, said first test lead is connected to said positive terminal of said battery, said second test lead is connected to said positive battery cable removed from said positive terminal of said battery, and said ground lead is connected to an electrical ground or a chassis of said vehicle, such that if said battery has electrical power, both said first incandescent lamp and said second illuminating means will be illuminated, but if said battery has no electrical power, neither said first incandescent lamp nor said second illuminating means will be illuminated; and g. when said test device is used for indicating whether there is a short-circuit in said electrical element of said vehicle, said fuse protecting said electrical element is removed, said first test lead is connected to said positive terminal of said fuse junction, said second test lead is connected to said negative terminal of said fuse junction, and said ground lead is connected to an electrical ground or said chassis of said vehicle, such that if there is no electrical short-circuit in said electrical element, both said first incandescent lamp and said second illuminating means will be illuminated, but if there is an electrical short-circuit in said electrical element, said first illuminating means will be illuminated but said second incandescent lamp will not be illuminated.

6. The test device in accordance with claim 5, further comprising a circuit breaker connected between said second terminal of said first illuminating means and said first terminal of said second illuminating means for protecting the tested particular electrical wiring of said vehicle and said test device from damage.

7. The test device in accordance with claim 5, further comprising a first connector connected to the other end of said first lead.

8. The test device in accordance with claim 5, further comprising a second connector connected to the other end of said second lead.

9. The test device in accordance with claim 5, wherein said first and second illuminating means includes an incandescent lamp.

10. The test device in accordance with claim 5, wherein said first illuminating means is of one color and said second illuminating means is of another color.

* * * * *